US006802928B2

(12) United States Patent
Nakashima

(10) Patent No.: US 6,802,928 B2
(45) Date of Patent: Oct. 12, 2004

(54) METHOD FOR CUTTING HARD AND BRITTLE MATERIAL

(75) Inventor: Akira Nakashima, Tokyo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 0 days.

(21) Appl. No.: 10/397,957

(22) Filed: Mar. 26, 2003

(65) Prior Publication Data

US 2004/0083863 A1 May 6, 2004

(30) Foreign Application Priority Data

Mar. 29, 2002 (JP) ....................................... 2002-093945

(51) Int. Cl.$^{7}$ ........................... B32B 1/00; C30B 33/00; B26D 7/01

(52) U.S. Cl. ......................... 156/268; 156/64; 156/378; 156/257; 156/510; 125/35; 125/13.01

(58) Field of Search .......................... 156/64, 250, 257, 156/268, 378, 510; 125/35, 13.01

(56) References Cited

U.S. PATENT DOCUMENTS 5,024,207 A * 6/1991 Harbarger et al. ............ 125/35

FOREIGN PATENT DOCUMENTS

| | | | |
|---|---|---|---|
| JP | 11-77663 | 3/1999 | ............ B28D/5/04 |
| JP | 2001-18219 | 1/2001 | ............ B28D/1/28 |

* cited by examiner

*Primary Examiner*—Linda L Gray
(74) *Attorney, Agent, or Firm*—Darby & Darby

(57) ABSTRACT

It is an object of the present invention to provide a method for slicing a hard and brittle material having a crystal structure, such as a silicon ingot, and more particularly a hard and brittle material cutting method which solves the problem of worsening variance in thickness, nanotopography, and wafer warpage. The inventors perfected the present invention upon discovering that when retainer plates are bonded to or pressed against the ends of an ingot, and simultaneous slicing with a wire saw is performed along with the retainer plates, a portion of increasing variance in the warpage, nanotopography, and thickness will appear in the portions corresponding to the retainer plates, resulting in a decrease in variance in wafer warpage, nanotopography, and thickness at the ends of the targeted ingot.

6 Claims, 5 Drawing Sheets

PRIOR ART

METHOD FOR CUTTING HARD AND BRITTLE MATERIAL

BACKGROUND OF THE INVENTION

1. Field of the Invention

The present invention relates to an improved method for cutting a hard and brittle material having a crystal structure, such as a silicon ingot, with a wire saw, and more particularly relates to a method for cutting a hard and brittle material with which variance in the warpage, nanotopography, and thickness of sliced wafers is reduced at all locations in the lengthwise direction of the ingot, and particularly at the ends, when the material is affixed to a fixing jig and sliced after its crystal orientation has been measured.

2. Description of the Related Art

Wire saw cutting devices, which use moving wires to simultaneously slice a large number of wafers from a columnar silicon monocrystalline ingot, have been widely used to manufacture wafers, which are semiconductor substrate materials.

FIG. 1 illustrates an example of the structure of a wire saw cutting device used for silicon monocrystalline ingots. As shown, in order to cut a large number of wafers at the same time from a silicon monocrystalline ingot, a wire 4 is wound around the outer periphery of three long rollers 1, 2, and 3 disposed in parallel, with the wire strands parallel and at a specific spacing, and the wire 4 played out from one wire bobbin 5 goes around the outer periphery of these rollers 1, 2, and 3 and then is wound up on another wire bobbin 6.

A silicon monocrystalline ingot 7 is affixed to a jig 8 at the place where the wires 4 are moving in the same direction and arranged at a specific spacing in the axial direction between the upper two rollers 2 and 3, and this jig 8 is lowered while being mechanically supported by a separate supporting mechanism (not shown), which presses the ingot against the wires 4 and cuts the ingot. In another configuration, the monocrystalline ingot 7 is pressed against the wires by being raised, rather than lowered.

Slicing with a wire saw is performed as above, but with a hard and brittle material having a crystal structure, such as a silicon monocrystalline ingot, because of the need to specify the crystal plane of the sliced wafers, the crystal orientation of the ingot 7 (the workpiece) with respect to the wire saw must be adjusted after the ingot is affixed to the jig 8. An orientation adjusting mechanism, which adjusts the crystal orientation by rotating the ingot 7 along with the jig 8, is therefore provided to the supporting mechanism that supports the jig 8, and this mechanism is used to adjust the crystal orientation.

Since productivity is diminished by providing an orientation adjusting mechanism to the support mechanism of the jig 8 as above, one approach that has been taken is to measure the crystal orientation of an ingot ahead of time, and affix the fixing jig 8 in the lengthwise direction at the required location of the outer peripheral surface of the material so that the ingot will be facing in the required direction during slicing (see Japanese Laid-Open Patent Application H11-77663).

In any case, as the diameter of a silicon monocrystalline ingot being sliced with a wire saw increases, there is a tendency for the warpage of wafers at the center of the ingot to be consistent, and for the warpage of wafers to worsen toward the ends of the ingot.

Also, Japanese Laid-Open Patent Application 2001-18219 discusses as a working example a method in which a silicon disk with a thickness of 20 mm and a diameter of 76 mm is used as an anti-warping member that is bonded with an adhesive to the end faces of a piece of silicon with a diameter of 76 mm and a thickness of 10 mm, this sample is disposed so that the center axis of the sample is aligned with the center axis of a primary coil and so that the primary coil and the sample are not in electrical contact with copper wiring, a voltage of 20 kV is applied to a capacitor, and after this charging, a switch is closed to generate a pulse magnetic field in the primary coil, and the above-mentioned silicon with a thickness of 10 mm is sliced.

With this method, which involves pulse magnetic field cutting using a conductor, either a member that prevents warpage is bonded to the ends of the material being cut, or the cutting is performed with this member pressed against the material, the primary object being to prevent buckling of the material being cut. With this cutting method, however, when a large number of wafers are cut from a long, slender ingot, it is impossible to reduce variance in the nanotopography and thickness of the wafers.

SUMMARY OF THE INVENTION

It is an object of the present invention to provide a method for slicing a hard and brittle material having a crystal structure, such as a silicon ingot, and more particularly a hard and brittle material cutting method which solves the problem of worsening variance in thickness, nanotopography, and wafer warpage.

As a result of close scrutiny of what an ingot undergoes during slicing, in an effort to reduce the warpage of wafers sliced from the ends of the ingot, the inventors perfected the present invention upon discovering that when retainer plates are bonded to or pressed against the ends of an ingot, and simultaneous slicing with a wire saw is performed along with the retainer plates, a portion of increasing variance in the warpage, nanotopography, and thickness will appear in the portions corresponding to the retainer plates, resulting in a decrease in variance in wafer warpage, nanotopography, and thickness at the ends of the targeted ingot.

Specifically, the present invention is a method for cutting a hard and brittle material, comprising the steps of:

measuring the lengthwise and peripheral crystal orientation of a columnar hard and brittle material having a crystal structure;

fixing a jig plate in the lengthwise direction of the outer peripheral surface of said material;

setting the tilt angle of the crystal plane of said material;

bonding or pressing a retainer plate on one or both end faces of said material; and moving a wire saw relatively from the outer peripheral surface that is on the unrestrained side and bound to the jig, toward the jig, and thereby slicing the material into a large number of disk-shaped wafers.

The present invention is also a cutting method comprising the above steps, wherein the retainer plate is a disk, ring, or perforated disk of substantially the same diameter as the columnar hard and brittle material, or wherein the retainer plate is composed of either the same material as the columnar hard and brittle material, or of glass, ceramic, carbon, or resin, or wherein the pressing means presses a disk, ring, or perforated disk against said end face with a plurality of pins.

DETAILED DESCRIPTION OF PREFERRED EMBODIMENTS

The fixing jig 8 of the standard wire saw cutting device shown in FIG. 1 will now be described in detail. As shown in FIG. 2, the jig 8 comprises a workpiece plate 8*a* supported on a supporting mechanism (not shown), and a slicing platform 8*b* that is mounted to the workpiece plate 8*a* and to which an ingot 7 is bonded.

Figure 3:
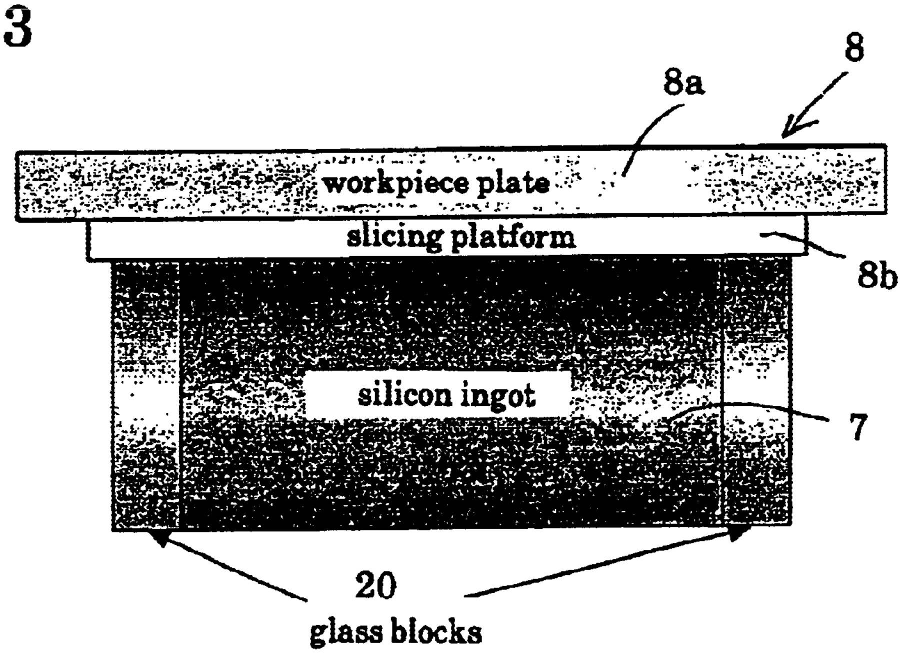
PRIOR ART Fig. 3
FIG. 3 is a diagram illustrating the relationship between the slicing jig and the silicon ingot in the slicing method pertaining to the present invention.

The jig 8 and the ingot 7 shown in FIG. 3 are used in the slicing method of the present invention. The crystal orientation of the ingot 7 is measured with an X-ray crystal orientation measurement apparatus, and the tilt angle of the crystal plane and other such information pertaining to the mounting position on the jig 8 is determined, after which the ingot 7 is bonded to the slicing platform 8*b* and then mounted on the workpiece plate 8*a*.

Next, retainer plates 20 of the required thickness and the same outside diameter are bonded to both ends of the ingot 7, and the tilt angle of the crystal plane of the ingot 7 is adjusted. The retainer plates 20 can also be mounted prior to the bonding of the ingot 7 to the slicing platform 8*b*. Here, the ingot 7 is bonded to the slicing platform 8*b* after the crystal orientation is measured and the mounting position is set, and the fine-tuning of the orientation is also performed after mounting to the cutting device, but the measurement of the crystal orientation can also be performed simultaneously with the mounting, or the step of measuring the crystal orientation and the step of setting the tilt angle can also be performed in the opposite order, such as when the crystal orientation is measured after mounting is performed and the adjustment is performed after mounting to the cutting device, and the steps can be carried out simultaneously or consecutively.

Figure 1:
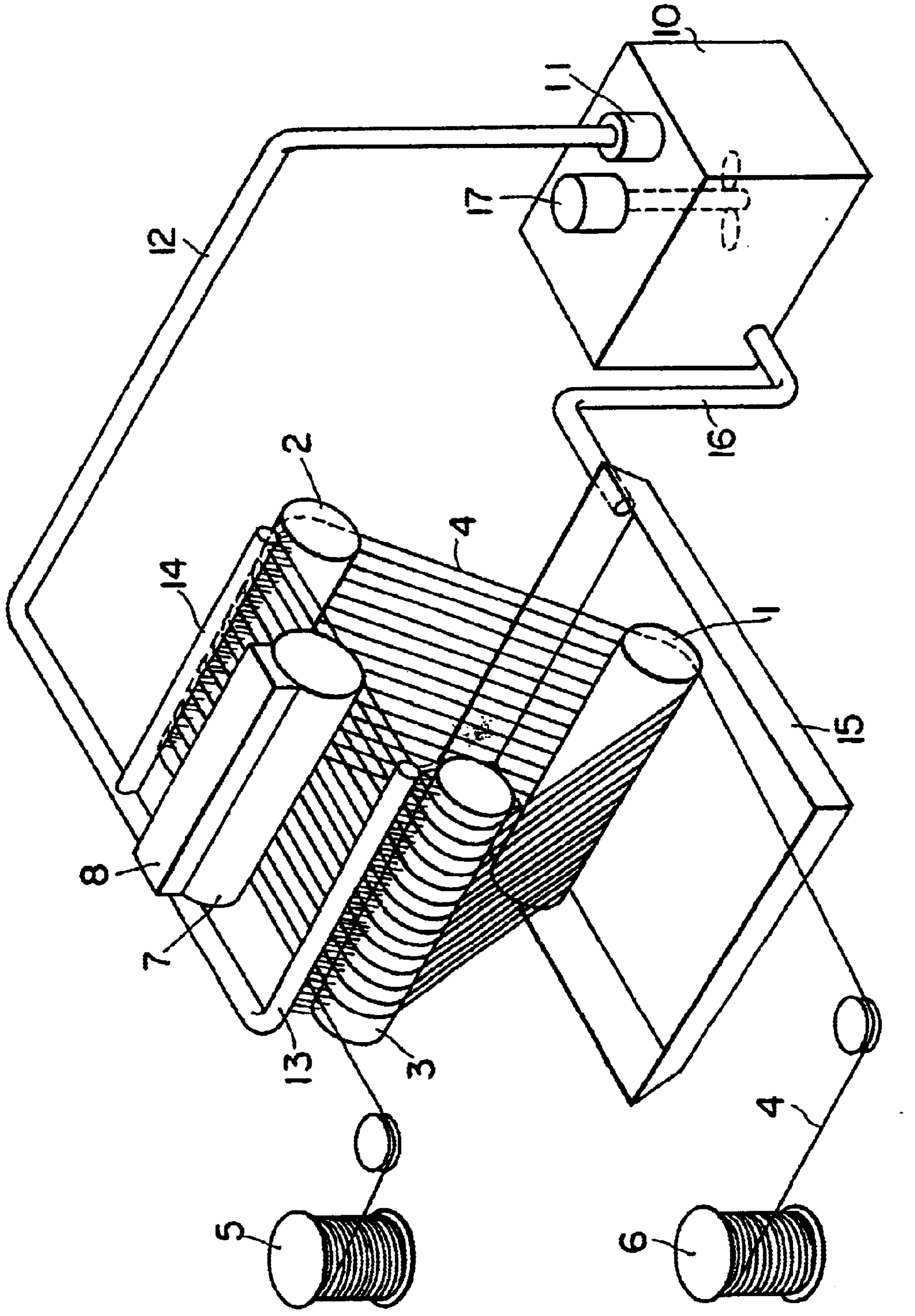
FIG. 1 is a simplified oblique view illustrating the wire saw cutting device and slurry feed system used in a conventional manufacturing method.
Figure 2:
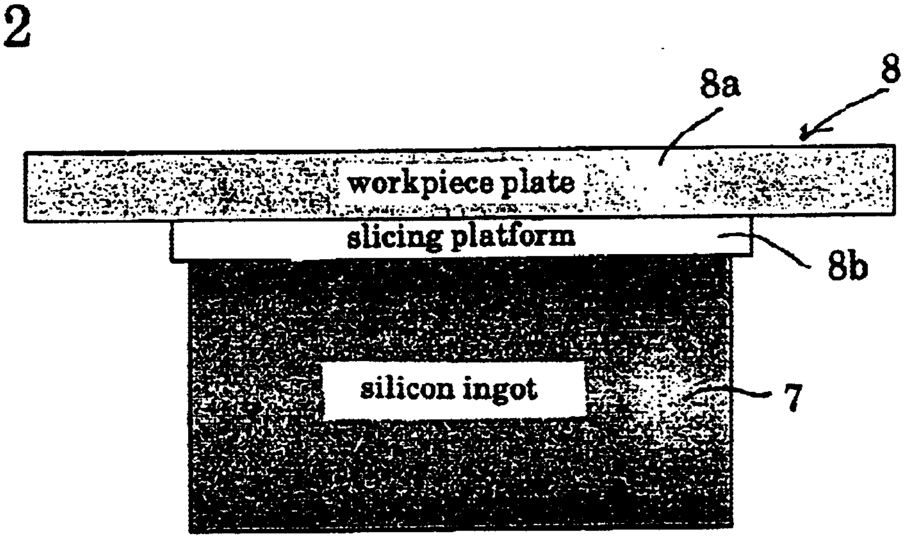
FIG. 2 is a diagram illustrating the relationship between the slicing jig and the silicon ingot in a conventional slicing method.

After being mounted to the jig 8, the ingot 7 is lowered in the wire saw cutting device in FIG. 1, which results in a wire saw 4 being moved through the ingot 7 from its outer peripheral surface on the unrestrained side toward the jig 8, thereby slicing the ingot into a large number of disk-shaped wafers. It is also possible for the jig 8 to be fixed and for the wire saw side to move.

The retainer plates 20 affixed to the ends of the ingot 7 are also sliced at the same time here. The effect of thus slicing the retainer plates 20 is that the ends of the ingot 7, where wafer warpage tends to be worse, correspond to the retainer plates 20, which dramatically reduces variance in the warpage, nanotopography, and thickness of the wafers that are actually sliced from the ends of the ingot 7.

Because the retainer plates 20 are sliced at the same time, it is preferable for them to be made from the same material as the ingot 7, or from a highly hard and brittle material having the same hardness. Glass, ceramic, carbon, or a hard resin can be used, for example. It is preferable for the retainer plates to be in the form of a disk, ring, or perforated disk because this will further reduce variance in wafer warpage, nanotopography, and thickness. The above-mentioned "perforated disk" refers to a configuration in which two or more holes are made, rather than a single hole being provided in the center of a ring. It is also preferable for the outside diameter of the retainer plates to be the same as that of the ingot 7 because they are sliced at the same time, but the same effect can be obtained even if the diameter is somewhat larger or smaller.

Reducing the warpage of wafers taken from the ends of the ingot 7 is also possible when the retainer plates 20 are bonded to the ends of the ingot 7 and just the ingot 7 is sliced, but there will be no reduction in variance in nanotopography or thickness.

When the retainer plates are bonded to the ends of the ingot 7 and sliced along with the ingot, this reduces variance in wafer warpage, nanotopography, and thickness during slicing, but even if these retainer plates are not bonded to the ends of the ingot, as long as they are sliced along with the ingot while being pressed and held against the sides of the ingot, it will still be possible to reduce variance in the warpage, nanotopography, and thickness of wafers taken from the end locations of the ingot.

In the pressing of the retainer plates, it is also possible for a plurality of columnar or slender rod-shaped pressing pins or rollers to be disposed around the periphery of the ends of the ingot, so that these will press on the ingot.

The mechanism by which the retainer plates are pressed against the ingot with a roller or the like can be, for example, an arrangement in which a mechanical mechanism such as a link mechanism that supports the retainer plates, etc., is suspended from the workpiece plate 8*a*, and the force of a cylinder or the like is used to press this mechanism against the ingot.

Also, the supporting or pressing mechanism can be provided to the entire jig 8 or just to the supporting mechanism of the jig 8.

EXAMPLES

Example 1

A silicon ingot with an outside diameter of 12 inches was bonded via a slicing platform to the workpiece plate of the jig in a wire saw cutting device. The ends of the bonded ingot were measured for the tilt angle of the crystal plane of the ingot using an X-ray crystal orientation measurement apparatus and using the workpiece plate as a reference.

Next, glass blocks of the same diameter as the ingot were bonded to the ends of the ingot with an adhesive. This ingot was then attached to a wire saw apparatus. The tilt angle of the ingot was corrected on the basis of the measurement data from the above-mentioned X-ray crystal orientation measurement apparatus, after which slicing was performed with a wire saw.

Two types of the above-mentioned glass blocks were readied as retainer plates, measuring 20 mm and 50 mm.

First, washing was performed after the slicing operation, and after the glass blocks were removed, the silicon wafers were checked for warpage, variance in thickness, and nanotopography after polishing.

Figure 4A:
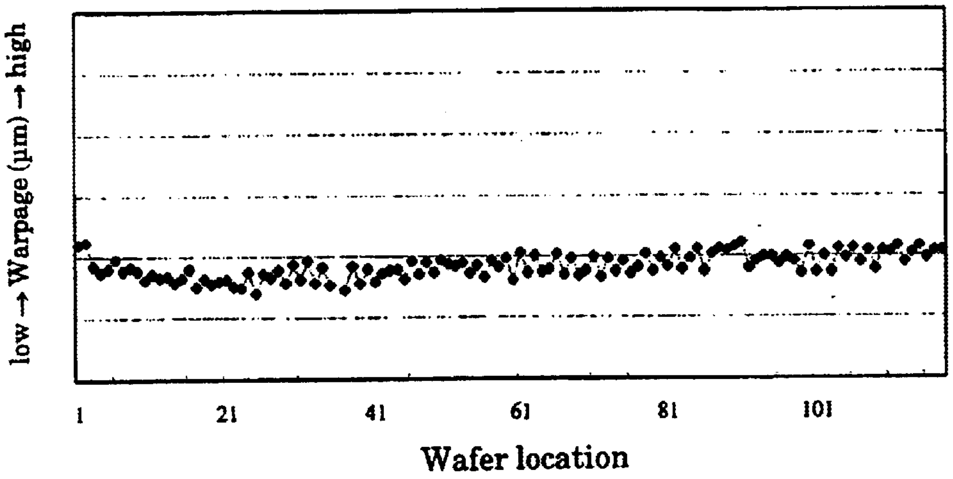
FIG. 4A is a graph of the relationship between warpage and the location where a silicon wafer is taken out of an ingot in the slicing method pertaining to the present invention.
Figure 4B:
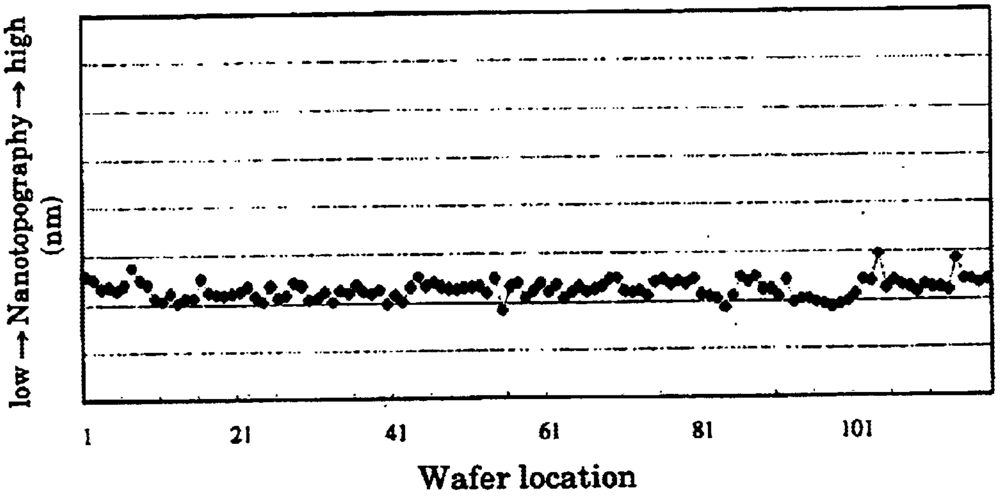
FIG. 4B is a graph of the relationship between nanotopography and the take-out location.
Figure 4C:
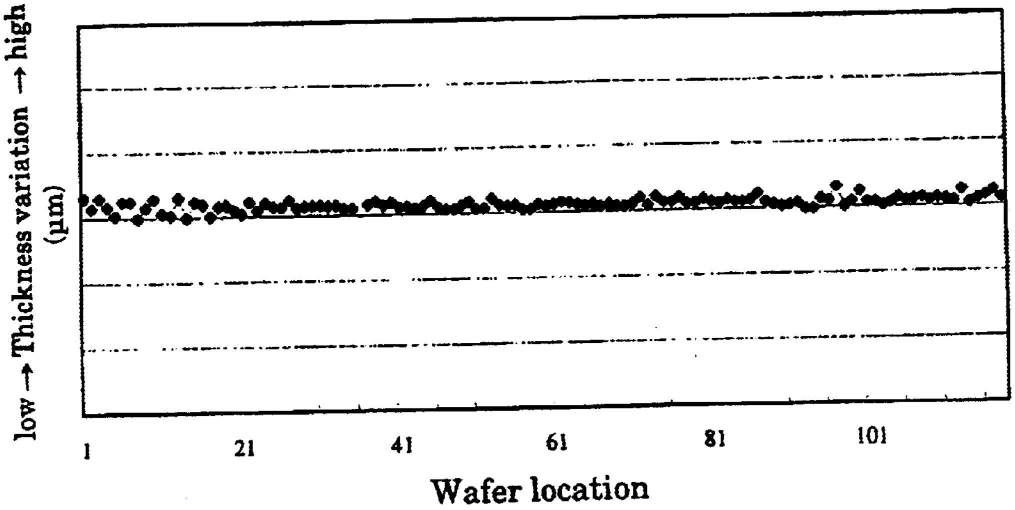
FIG. 4C is a graph of the relationship between thickness variance and the take-out location.

The variation in warpage, nanotopography, and thickness of the wafers were measured when the retainer plates with a 20 mm thickness were used, and these results were checked against the warpage, nanotopography, and thickness variation of at a location in the lengthwise direction of the ingot, the results of which were plotted in the graphs of FIGS. 4A, 4B, and 4C. It is clear that regardless of the slice location, there is little variance in warpage, nanotopography, and thickness. It was also confirmed that the trend was the same as in FIGS. 4A and 4B when retainer plates with a thickness of 50 mm were used.

Comparative Example 1

Using the same wire saw cutting device as in Example 1, a silicon ingot with an outside diameter of 12 inches was bonded via a slicing platform to a workpiece plate, the tilt angle of the crystal plane was measured, and then this ingot was attached to the wire saw device and the tilt angle of the ingot was corrected, after which slicing was performed with a wire saw. Washing was performed after the slicing operation, and the warpage, variance in thickness, and nanotopography after polishing were checked.

Figure 5A:
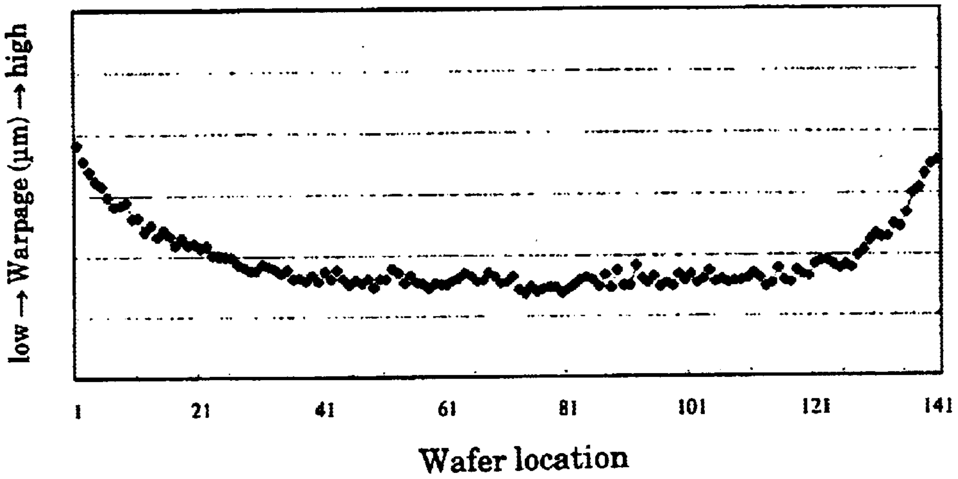
FIG. 5A is a graph of the relationship between warpage and the location where a silicon wafer is taken out of an ingot in a conventional slicing method.
Figure 5B:
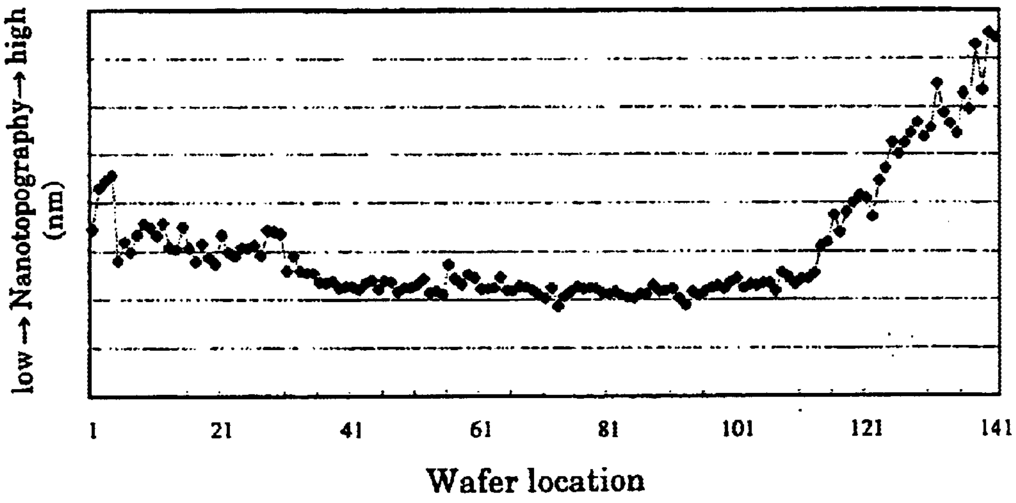
FIG. 5B is a graph of the relationship between nanotopography and the take-out location.
Figure 5C:
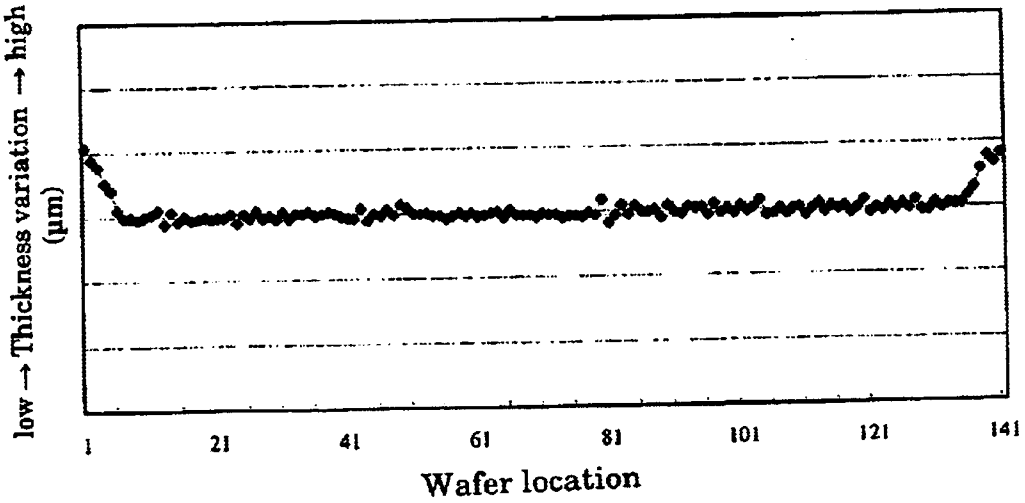
FIG. 5C is a graph of the relationship between thickness variance and the take-out location.

It can be seen from the graphs in FIGS. 5A, 5B, and 5C of the measurement results for wafer warpage and thickness variation that there was more variance in warpage, nanotopography, and thickness at the ends of the ingot.

Example 2

Using the same wire saw cutting device as in Example 1, a silicon ingot with an outside diameter of 12 inches was bonded via a slicing platform to a workpiece plate, the tilt angle of the crystal plane was measured, and then this ingot was attached to the wire saw device and the tilt angle of the ingot was corrected, after which the retainer plates of Example 1 were pressed against the ends of the ingot, and the slicing was performed while pressing on the retainer plates with a hydraulic cylinder via a plurality of rollers.

Washing was performed after the slicing operation, and the silicon wafers were checked for warpage, variance in thickness, and nanotopography after polishing, which confirmed that regardless of the slicing location, just as in FIGS. 4A, 4B, and 4C of Example 1, there was little variance in warpage, nanotopography, and thickness.

With the present invention, as is clear from the examples, when the crystal orientation of a silicon ingot is measured and the ingot is then fixed to a fixing jig and sliced, there is a marked reduction in the variance in the warpage, nanotopography, and thickness of the wafers sliced at all locations in the lengthwise direction of the ingot, but especially toward the ends, and regardless of the location in the ingot, uniform silicon wafers are obtained with little variance in nanotopography and thickness.

What is claimed is:

1. A method for cutting a hard and brittle material, comprising the steps of:

measuring the lengthwise and peripheral crystal orientation of a columnar hard and brittle material having a crystal structure;

fixing a jig plate around the outer peripheral surface in the axial direction of said material;

setting the tilt angle of the crystal plane of said material;

bonding or pressing a retainer plate on one or both end faces of said material; and moving a wire saw relatively from the outer peripheral surface not fixed and bound to the jig, toward the jig, and thereby slicing the retainer plate and the material into a large number of disk-shaped wafers.

2. A method for cutting a hard and brittle material, comprising the steps of:

measuring the lengthwise and peripheral crystal orientation of a columnar hard and brittle material having a crystal structure;

fixing a jig plate around the outer peripheral surface in the axial direction of said material;

setting the tilt angle of the crystal plane of said material;

bonding or pressing a retainer plate on one or both end faces of said material wherein the retainer plate is at least one of a disk, a ring, and a perforated disk of substantially the same diameter as the columnar hard and brittle material; and moving a wire saw relatively from the outer peripheral surface not fixed and bound to the jig, toward the jig, and thereby slicing the retainer plate and the material into a large number of disk-shaped wafers.

3. The method for cutting a hard and brittle material according to claim 1, wherein the retainer plate is composed of at least one of the same material as the columnar hard and brittle material, glass, ceramic, carbon, and resin.

4. A method for cutting a hard and brittle material, comprising the steps of:

measuring the lengthwise and peripheral crystal orientation of a columnar hard and brittle material having a crystal structure;

fixing a jig plate around the outer peripheral surface in the axial direction of said material;

setting the tilt angle of the crystal plane of said material;

pressing a retainer plate on one or both end faces of said material using a plurality of pins wherein the retainer plate is at least one of a disk, a ring, and a perforated disk; and moving a wire saw relatively from the outer peripheral surface not fixed and bound to the jig, toward the jig, and thereby slicing the retainer plate and the material into a large number of disk-shaped wafers.

5. The method for cutting a hard and brittle material according to claim 2, wherein the retainer plate is composed of at least one of the same material as the columnar hard and brittle material, glass, ceramic, carbon, and resin.

6. The method for cutting a hard and brittle material according to claim 4, wherein the retainer plate is composed of at least one of the same material as the columnar hard and brittle material, glass, ceramic, carbon, and resin.

* * * * *